United States Patent [19]
Thompson et al.

[11] Patent Number: 5,906,364
[45] Date of Patent: *May 25, 1999

[54] AIR BLADDER FIXTURE TOOLING FOR SUPPORTING CIRCUIT BOARD ASSEMBLY PROCESSING

[76] Inventors: Curtis C. Thompson, 1106 W. Greenhead Rd., Meridian, Id. 83642; Steve Abrahamson, 8588 W. Brookview Dr., Boise, Id. 83709

[*] Notice: This patent is subject to a terminal disclaimer.

[21] Appl. No.: 09/021,791

[22] Filed: Feb. 11, 1998

Related U.S. Application Data

[63] Continuation of application No. 08/800,069, Feb. 12, 1997, Pat. No. 5,820,117, which is a continuation of application No. 08/496,046, Jun. 28, 1995, abandoned.

[51] Int. Cl.[6] .............................. B23Q 3/08; B25B 11/00
[52] U.S. Cl. ............................................................. 269/22
[58] Field of Search ........................... 269/22, 266, 903; 254/93 HP; 92/90, 93, 94, 96

[56] References Cited

U.S. PATENT DOCUMENTS

| | | | |
|---|---|---|---|
| 3,345,897 | 10/1967 | Pearson | 269/22 |
| 3,608,809 | 9/1971 | Cushman | 269/22 |
| 3,700,226 | 10/1972 | Mrugala | 269/22 |
| 4,518,151 | 5/1985 | Dill | 254/93 HP |
| 4,687,189 | 8/1987 | Stoll et al. | 269/22 |
| 4,813,657 | 3/1989 | Todd | 269/22 |

*Primary Examiner*—Robert C. Watson
*Attorney, Agent, or Firm*—Hopkins Roden Crockett Hansen & Hoopes, PLLC

[57] ABSTRACT

A fixture tooling for supporting a back side of a printed circuit board during component placement on a top side of the board includes an inflatable air bladder that is sized substantially coextensive with the circuit board. The bladder is positioned below the circuit board within a containment unit adapted for use with conventional railed assembly equipment. The bladder is selectively inflated for supporting the complete back side of the printed circuit board during assembly operations. The bladder provides evenly distributed support across, substantially, the entire circuit board without damaging any components on the back side by pliably conforming to component irregularities on the back side.

14 Claims, 3 Drawing Sheets

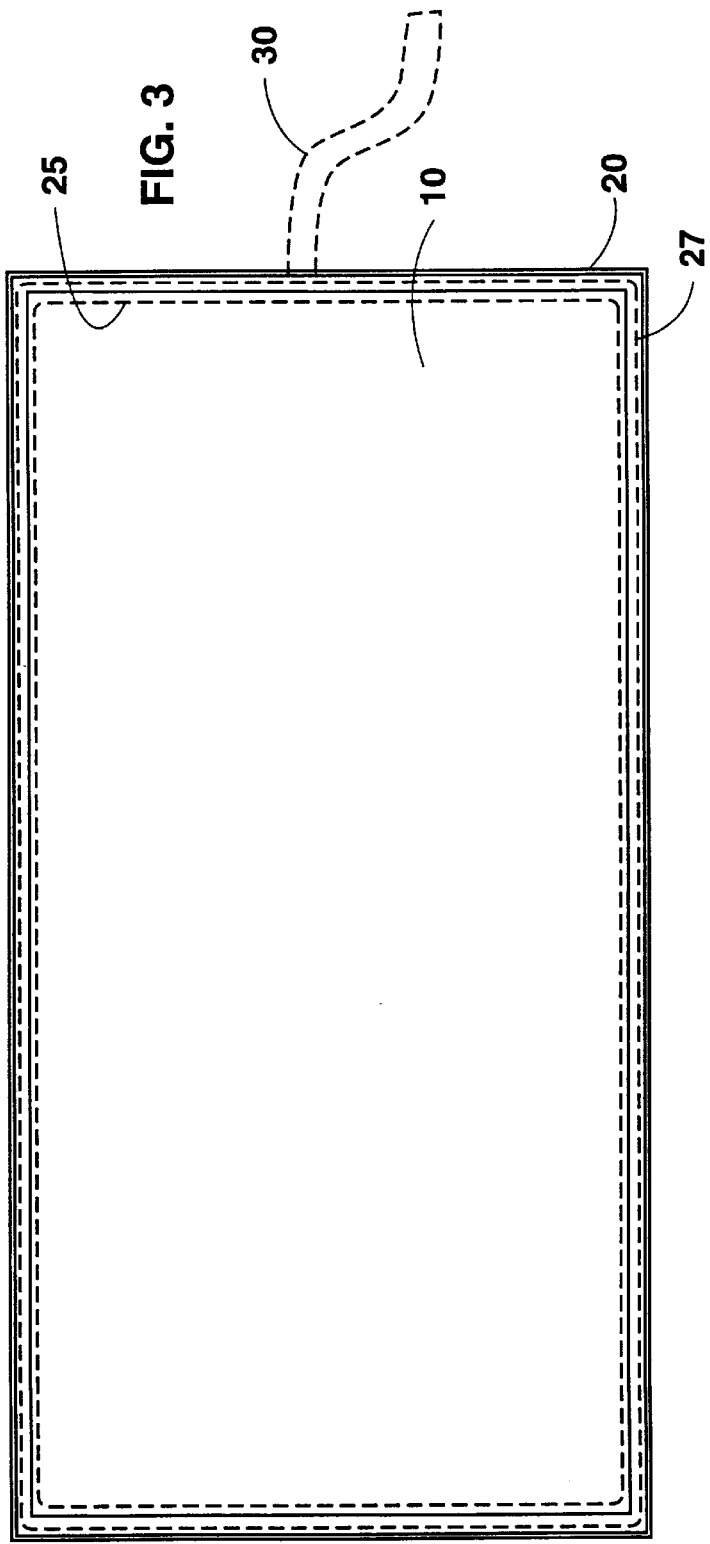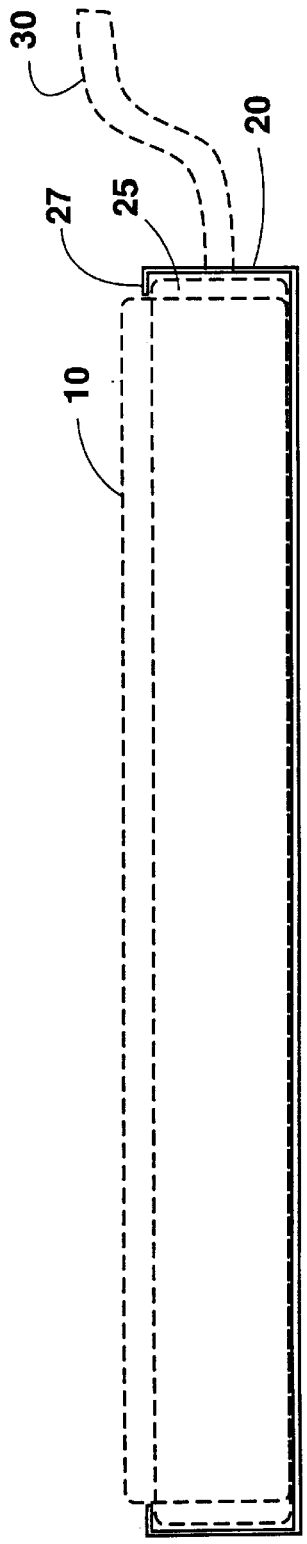

AIR BLADDER FIXTURE TOOLING FOR SUPPORTING CIRCUIT BOARD ASSEMBLY PROCESSING

CROSS REFERENCES TO RELATED APPLICATIONS

This application is a continuation of application Ser. No. 08/800,069, filed Feb. 12, 1997, now U.S. Pat. No. 5,820,117 which is a continuation of application Ser. No. 08/496,046, filed Jun. 28, 1995, now abandoned.

TECHNICAL FIELD

This invention relates in general to printed circuit board assembly processing and, more particularly, to fixture tooling for supporting a printed circuit board during the component placement process.

BACKGROUND OF THE INVENTION

The increasing complexity and density of integrated circuit components on printed circuit assemblies has resulted in the common use of robotic systems for manufacturing and assembly of the same. Accordingly, various techniques have been developed for the automated mounting of electronic components to printed circuit boards (PCBs). One such technique is the "hot bar thermode" bonding technique which utilizes a placement head to position an integrated circuit having a plurality of conductive leads at a desired mounting point on a PCB. Thereafter, multiple heat activatable blades are urged into contact with the conductive leads and heated to a point where the electronic component is bonded to the circuit board by means of presoldered connections thereon.

Another technique involves using a solder paste and a reflow oven. Specifically, a powdered metal such as a tin/lead composition is mixed with a liquidous flux (activator) agent whereby the mixture becomes a solder paste. The paste is positioned at a desired mounting point on the PCB, the conductive leads of the integrated circuit are placed on the solder paste, and then the assembly is heat treated in a reflow oven. The heat treatment burns off the flux, which cleans the surfaces of the pads and component, and solidifies the bonding of the component leads to the solder and PCB.

Regardless of the technique used for component placement and PCB assembly, substantial forces may be exerted on the PCB by the automated placement head. Accordingly, assembly processing requires back side support of the circuit board (or substrate) capable of withstanding such forces. The back side support must provide good, solid support for allowing even, accurate placement of components on the top side. Good support is especially needed where fine-pitched component leads are being placed. The support, however, must also avoid damaging components on the back side of the PCB in the case where a double sided board is used. Furthermore, the support must be evenly distributed and sufficiently solid under the placement area to avoid cracking of solder joints (breaking of component leads from existing solder joints) which often occurs to previously placed components on the back side of the board during the placement of another component on the top side if support is not proper.

One apparatus and method known in the art that is used for back side support is a pin insert tooling plate whereby multiple, removably adjustable support pins are manually configured in the tooling plate so that the pins are strategically positioned to best support the back side of a PCB for component placement on the top side. In the case of a double sided PCB where components are already placed on the back side, the pins must be carefully positioned to avoid contacting and damaging the components on the back side. Although this technique provides a usable solution for supporting the back side of a PCB, it entails a cumbersome, time consuming, and often difficult process to ensure the pins are properly positioned.

Another apparatus and method for supporting the back side of a PCB is disclosed in U.S. Pat. No. 5,092,510, issued to Anstrom et al. In this instance, a support fixture is positioned under the back side of the PCB and urged upward into temporary contact opposite the mounting location on the top side of the PCB. In one embodiment, a flexible fluid filled bag is utilized in conjunction with the support fixture so that the presence of components on the back side of the circuit board may be accommodated while supporting the circuit board during component mounting. The support fixture may also be selectively rotated to accommodate rectangular components in multiple orientations.

Although the Anstrom technique provides a usable solution for back side support, it requires significant circuit and mechanical complexities in order to constantly position the support fixture opposite the mounting location on the other side. Such complexities, obviously, contribute to undesirable, excessive, manufacturing costs. Furthermore, the support fixture only provides support to a single mounting location on the top side of the PCB. Consequently, either the support fixture or the PCB must constantly be positioned to mirror component placement on the top side.

Given these limitations of the prior art, there is a clear need for an improved PCB support apparatus and method. Accordingly, objects of the present invention are to provide a mechanically simplified, easy-to-use, and cost effective support apparatus and method for component placement and other PCB assembly purposes.

SUMMARY OF THE INVENTION

According to principles of the present invention in a preferred embodiment, a fixture tooling for supporting a back side surface of a printed circuit board during component placement on a top side of the board includes an inflatable air bladder that is sized substantially coextensive with the circuit board. The bladder is positioned below the circuit board within a containment unit adapted for use with conventional railed assembly equipment. The bladder is selectively inflated for supporting the back side of the printed circuit board during assembly operations.

Advantageously, the present invention air bladder provides evenly distributed support across, substantially, the entire circuit board without damaging any components on the back side by pliably conforming to component irregularities. Furthermore, the air bladder provides a quick, easy, and cost effective means for setting-up circuit board assembly operations.

Other objects, advantages, and capabilities of the present invention will become more apparent as the description proceeds.

BRIEF DESCRIPTION OF THE DRAWINGS

FIG. 3 is a top view of the containment box showing how the bladder (in phantom) is positioned within the box.

FIG. 4 is an elevation view of the containment box showing how the bladder (in phantom) is positioned within the box.

DETAILED DESCRIPTION OF THE INVENTION

Figure 1:
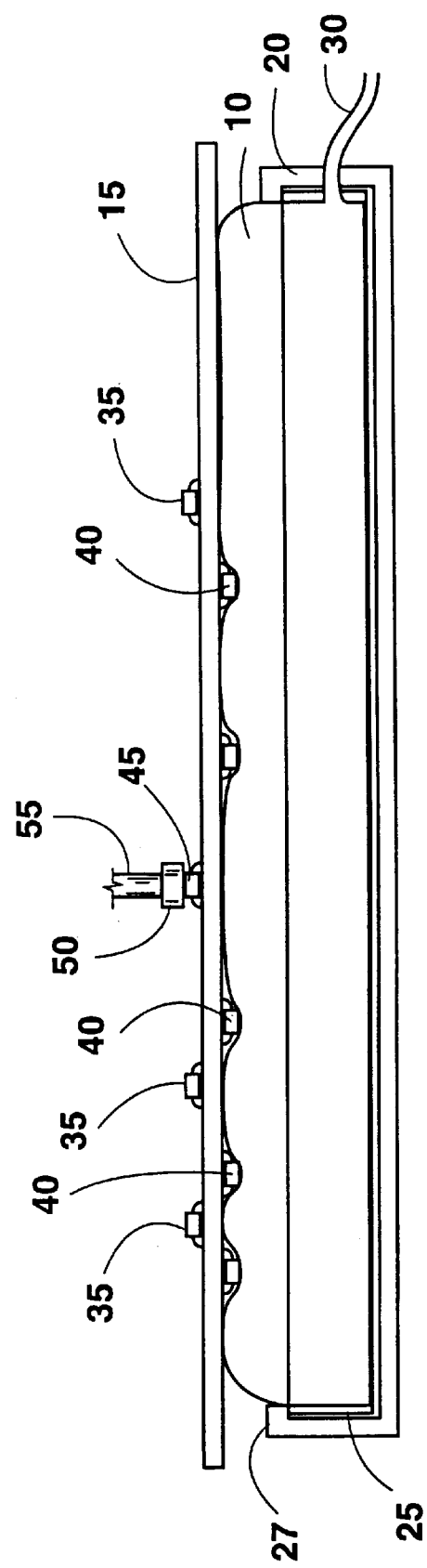
FIG. 1 is a partial cut-away elevational view of the present invention air bladder fixture tooling supporting a printed circuit board during component placement assembly operations of the circuit board.

FIG. 1 is a partial cut-away elevational view of the present invention air bladder 10 fixture tooling supporting a back side surface of printed circuit board (PCB) 15 during component placement assembly operations on a top side surface of the circuit board. Bladder 10 is contained within containment unit (box) 20 by flange strip 25 attached around, or formed as part of, bladder 10. Lip 27 of box 20 catches flange 25 to hold bladder 10 within the box. Supply tube 30 allows bladder 10 to be selectively inflated and deflated as necessary during assembly operations for supporting the back side of PCB 15. However, once the bladder is inflated with its correct air pressure it generally does not need to be deflated until a next setup for processing of a completely different PCB assembly.

PCB 15 is any conventional printed circuit substrate and may include electronic components 35 on its top side and components 40 on its back side. Component 45 is shown as being placed on the top side of PCB 15 by placement head 50 which is mounted on manipulator arm 55. Manipulator arm 55 is connected to a conventional, automated placement system as well known in the art.

Bladder 10 is of a peripheral dimension substantially coextensive with the peripheral dimensions of PCB 15. In the preferred embodiment, however, substantially coextensive means bladder 10 is slightly smaller in width than PCB 15 to allow bladder 10 to fit within a rail assembly (see FIG. 2) used for assembly operations. Although a preferred length dimension of bladder 10 is substantially similar to a length of PCB 15, the length could easily be smaller or larger than the length of the PCB and still accomplish its intended supportive purposes. In either case, the effectiveness of the supportive aspects of the invention begins to diminish, at some point, as the variance in the dimensions of bladder 10 relative to PCB 15 increases. Preferably, a majority of the back side, if not substantially the entire back side, of PCB 15 is supported by bladder 10 for component placement on the top side. However, where the edges of PCB 15 are already solidly supported, such as in conventional rail systems, it is not detrimental for bladder 10 to be substantially smaller than the PCB.

In locations where back side components 40 are mounted on PCB 15, bladder 10 easily conforms to their shapes in its inflated state. As such, damage to the components is avoided while still rendering the necessary support for placement of components on the top side. Preferably, bladder 10 is made of a coated fabric, vulcanized rubber, or polyurethane material adapted to provide proper electrostatic discharge safety features. However, other pliable materials may be equally suitable. Furthermore, a layer of material (wall) of bladder 10 is preferably a thickness of between about 30/1000s of an inch to about 50/1000s of an inch (0.03–0.05 inches) so that it will properly conform to irregularities on the back side due to existing components, and yet still render the proper and necessary support. However, the thickness is dictated by physical properties of the material, such as pliability, strength, and conformance. Typically, the bladder is inflated with air to about 2–10 psi so it will conform to irregularities on the back side of the board. However, other gaseous or liquid fluids may likewise be used to inflate the bladder.

Figure 2:
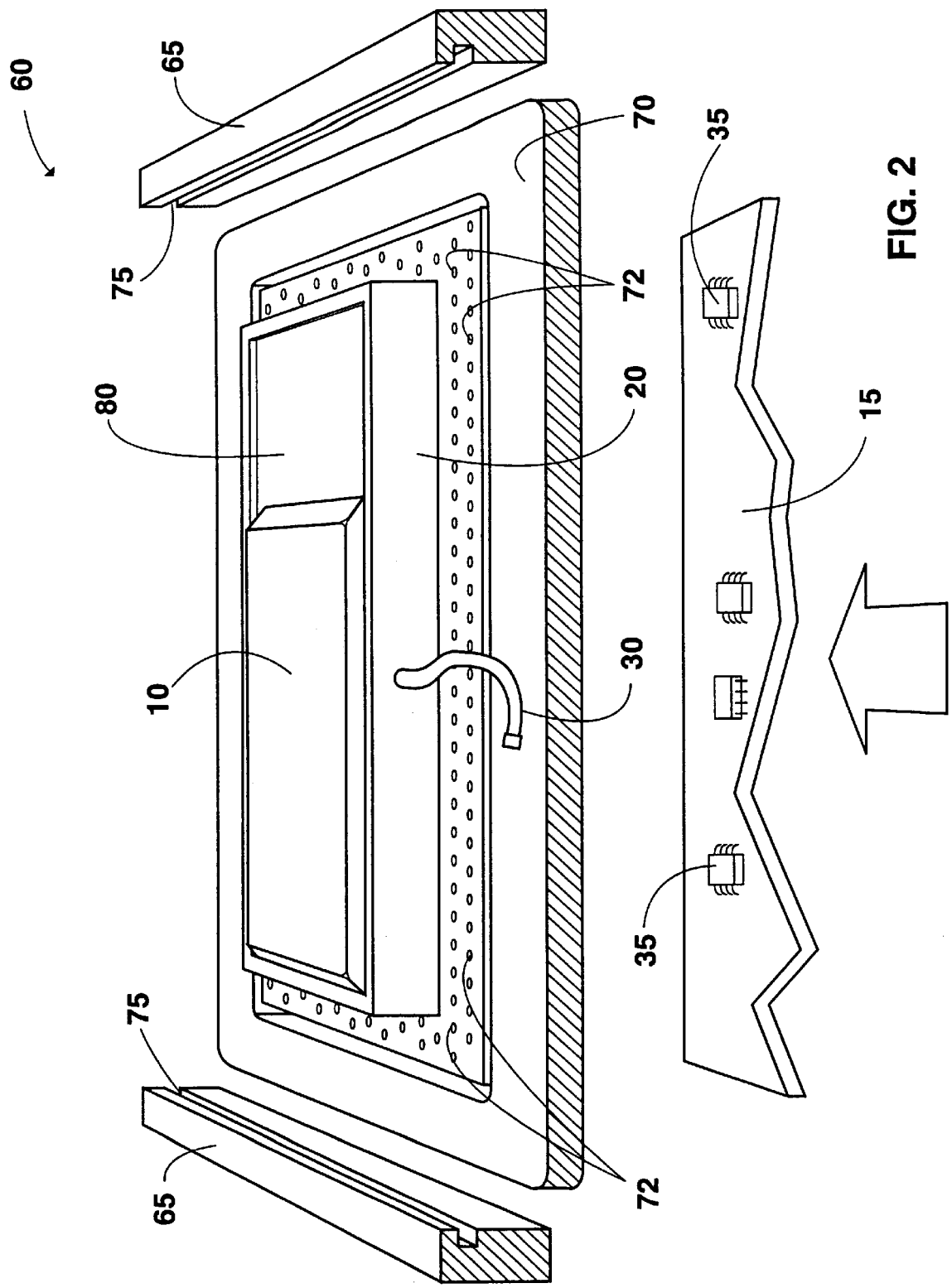
FIG. 2 is a front perspective (partial section) view of the air bladder and its containment box set in railed assembly equipment.

FIG. 2 is a front perspective (partial section) view of air bladder 10 and its containment box 20 set in railed assembly equipment 60. Railed assembly 60 is any conventional railed assembly equipment in the art commonly used for PCB assembly and, specifically, component placement purposes. Although bladder 10 is shown as being used in this particular railed assembly configuration, it is obvious that bladder 10 could equally be used for supporting a printed circuit board in other assembly configurations. In this embodiment, railed assembly 60 includes rails 65 and base plate (table) 70. Rails 65 include slots 75 for retaining PCB 15 during component placement. Typically, the edges of PCB 15 are placed in slots 75 above base plate 70 to hold the PCB for assembly.

Conventionally, in the prior art, base plate 70 may hold adjustable support pins (not shown), or the like, in apertures 72 for supporting a PCB during component placement. However, the inventive air bladder 10 and containment box 20 are shown resting on base plate 70 under principles of the present invention depicting the improvement over the prior art. This demonstrates the adaptability of bladder 10. Namely, it conforms to existing assembly equipment and provides an easy-to-use means for setting-up assembly operations. Containment box 20 is secured to base plate 70 by any conventional means. For example, pins may be attached to the bottom of box 20 and subsequently inserted into holes 72 in base plate 70. Alternatively, box 20 may be bolted to the base plate.

After box 20 and bladder 10 are positioned over base plate 70, a wide variety of conventional printed circuit boards 15 may be retained in slots 75 for assembly. Once a PCB is retained, bladder 10 is then inflated via air supply tube 30 to support the back side of the PCB. When the circuit board is assembled, bladder 10 may simply be deflated to allow a next board to be positioned for assembly. Alternatively, the entire base plate (table) 70 may drop down out of the way. Advantageously, if the next circuit board to be assembled includes a different configuration of components on the back side relative to the previous board, bladder 10 needs no adjustment (other than deflation/inflation) because its pliable, inflated surface provides support to most any back side component configuration on most any circuit board that fits within railed assembly 60.

FIG. 2 also shows an alternate embodiment of containment box 20 wherein adjustable cover plate 80 is placed over a portion of bladder 10 on box 20. Cover plate 80, optionally, is used to confine a portion of bladder 10 within box 20 such that the inflated, supportive surface area of bladder 10 is selectively reduced to a smaller area.

This feature allows bladder 10 to be adjustably confined within box 20 to easily adapt to different sized circuit boards. Specifically, if a circuit board that has a length shorter than bladder 10 is positioned for assembly, adjustable plate 80 is used to keep bladder 10 from protruding upward near the edge of the circuit board to avoid any potential manufacturing disruption or damage to the bladder. Accordingly, plate 80 is adjustable relative to box 20, and is any conventional plate that can retain bladder 10 within box 20. For example, plate 20 may be a metal plate having a lip feature for interlocking with box 20.

Referring now to FIGS. 3 and 4, a top and elevation view, respectively, of containment box 20 shows how bladder 10 (in phantom) is positioned within the box. Bladder 10 includes a flange strip (or edge piece) 25 formed as part of or attached to the periphery of bladder 10. Lip 27, around the periphery of box 20, catches (engages) flange 25 to hold bladder 10 in place. Air supply tube 30 extends from bladder 10 out through an opening in box 20 to allow for remote inflation/deflation of the bladder.

What has been described above are the preferred embodiments for an air bladder fixture tooling. It is clear that the present invention provides a simple yet powerful tool for supporting a circuit board during assembly processing. While the present invention has been described by reference to specific embodiments, it will be apparent that other alternative embodiments and methods of implementation or modification may be employed without departing from the true spirit and scope of the invention.

What is claimed is:

1. A fixture tooling for supporting a surface of a substrate, the fixture tooling comprising:
   (a) an inflatable bladder, wherein the inflatable bladder pliably conforms to irregularities on the surface of the substrate;
   (b) a pair of rails, each rail of said pair of rails having a slot formed therein; and,
   (c) a containment means for retaining the inflatable bladder;
      whereby upon inflation of the bladder, a majority of the surface of the substrate is supported for holding the substrate in response to forces received upon an opposite surface of the substrate, and wherein two edges of the substrate are supported in the slots of the pair of rails.

2. The fixture tooling of claim 1 wherein the inflatable bladder is made of a pliable material suitable for inflation purposes.

3. The fixture tooling of claim 1 wherein the inflatable bladder is coated with a material selected from the group consisting of polyurethane and rubber.

4. The fixture tooling of claim 1 wherein a wall of the inflatable bladder has a thickness of between about 0.03 inches to 0.05 inches for pliably conforming to the irregularities on the surface of the substrate.

5. The fixture tooling of claim 1 wherein the inflatable bladder includes a flange and the containment means includes a lip for engaging the flange and for holding the bladder within the containment means.

6. The fixture tooling of claim 1 wherein the containment means further includes a cover means for selectively covering a portion of the bladder for reducing an exposed, supportive surface area of the bladder for contact with the substrate.

7. The fixture tooling of claim 1 wherein the inflatable bladder is made of a material selected from the group consisting of polyurethane and rubber.

8. A fixture tooling for supporting a back side of a printed circuit assembly (PCB), the fixture tooling comprising:
   (a) an inflatable bladder having a periphery dimension substantially coextensive with a periphery of the PCB and whereby, upon inflation, the bladder pliably conforms to component irregularities on the back side of the PCB for supporting substantially the entire back side during assembly operations upon a top side of the PCB;
   (b) a railed, PCB assembly system including a pair of rails having a slot for engaging the PCB; and,
   (c) a containment box for retaining the inflatable bladder, wherein the containment box is removably attachable to the railed, PCB assembly system.

9. The fixture tooling of claim 8 wherein the inflatable bladder is made of a pliable material suitable for inflation purposes.

10. The fixture tooling of claim 8 wherein the inflatable bladder is coated with a material selected from the group consisting of polyurethane and rubber.

11. The fixture tooling of claim 8 wherein the bladder is made from a material selected from the group consisting of polyurethane and rubber.

12. The fixture tooling of claim 8 wherein a wall of the inflatable bladder has a thickness of between about 0.03 inches to 0.05 inches for pliably conforming to the irregularities on the surface of the PCB.

13. The fixture tooling of claim 8 wherein the inflatable bladder includes a flange and the containment box includes a lip for engaging the flange thereby holding the bladder within the containment box.

14. The fixture tooling of claim 8 wherein the containment box further includes a cover plate for selectively covering a portion of the bladder for reducing an exposed, supportive surface area of the bladder for contact with the substrate.

* * * * *